United States Patent [19]

Manabe et al.

[11] Patent Number: 4,963,956
[45] Date of Patent: Oct. 16, 1990

[54] SOLID IMAGE PICKUP APPARATUS

[75] Inventors: Sohei Manabe, Yokohama; Yoshiyuki Matsunaga, Kamakura; Nozomu Harada, Yokohama, all of Japan

[73] Assignee: Kabushiki Kaisha Toshiba, Kawasaki, Japan

[21] Appl. No.: 233,130

[22] Filed: Aug. 17, 1988

[30] Foreign Application Priority Data

Aug. 21, 1987 [JP] Japan .................................. 62-206418

[51] Int. Cl.⁵ ...................... H01L 27/14; H01L 31/00
[52] U.S. Cl. ................................................. 357/30 H
[58] Field of Search ............... 357/30 H, 30 P, 30 I, 357/30 G, 30 D, 30 S, 30 R, 32, 24 L, 24 R, 90

[56] References Cited

U.S. PATENT DOCUMENTS 3,845,295  10/1974  Williams et al. ................ 357/30 H
4,291,239  9/1981   Weimer ............................ 357/30 H
4,733,286  3/1988   Matsumoto ....................... 357/30 I

FOREIGN PATENT DOCUMENTS 2642194   3/1978  Fed. Rep. of Germany ... 357/30 H
61-133782 6/1986  Japan .

Primary Examiner—Rolf Hille
Assistant Examiner—Hoanganh Le
Attorney, Agent, or Firm—Oblon, Fisher, McClelland, Maier & Neustadt

[57] ABSTRACT

A solid image pickup apparatus comprises a plurality of photo sensing elements, arranged on a semiconductor substrate two-dimensionally and spaced mutually by specified distances, for outputting electric charges on receiving light, a semiconductor channel formed among the photo sensing elements and transferring electric charges output from the photo sensing elements. The semiconductor channel comprises cross-shaped channel members, each channel member being located inside four photo sensing elements. A plurality of vertical transfer electrodes, are provided on the channel members, for giving electric potential to the channel members and having electric charges transferred to the channel members of the next stages. Each of the channel members comprises a wide-width part and a narrow-width part located between the wide-width part and the channel member of the next stage. The narrow-width part is formed by an ion-implanting method to have a higher impurity concentration than that of the wide-width part.

12 Claims, 7 Drawing Sheets

TRANSFER DIRECTION

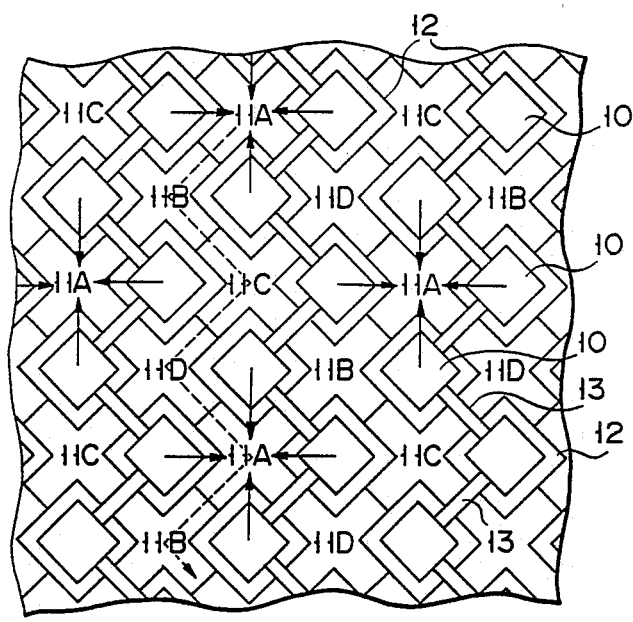
F I G. 1
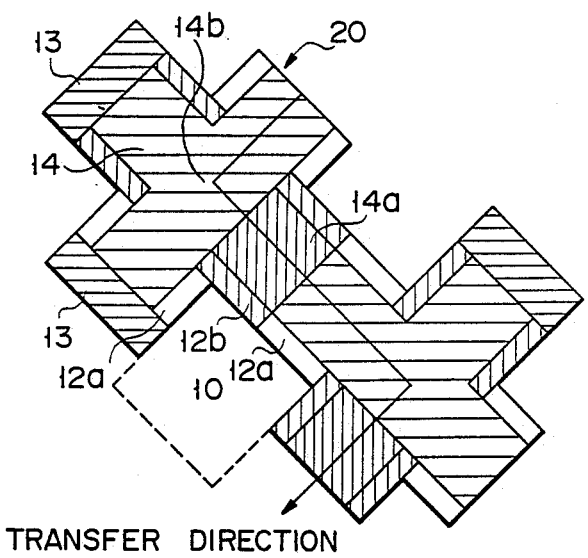
TRANSFER DIRECTION
F I G. 2

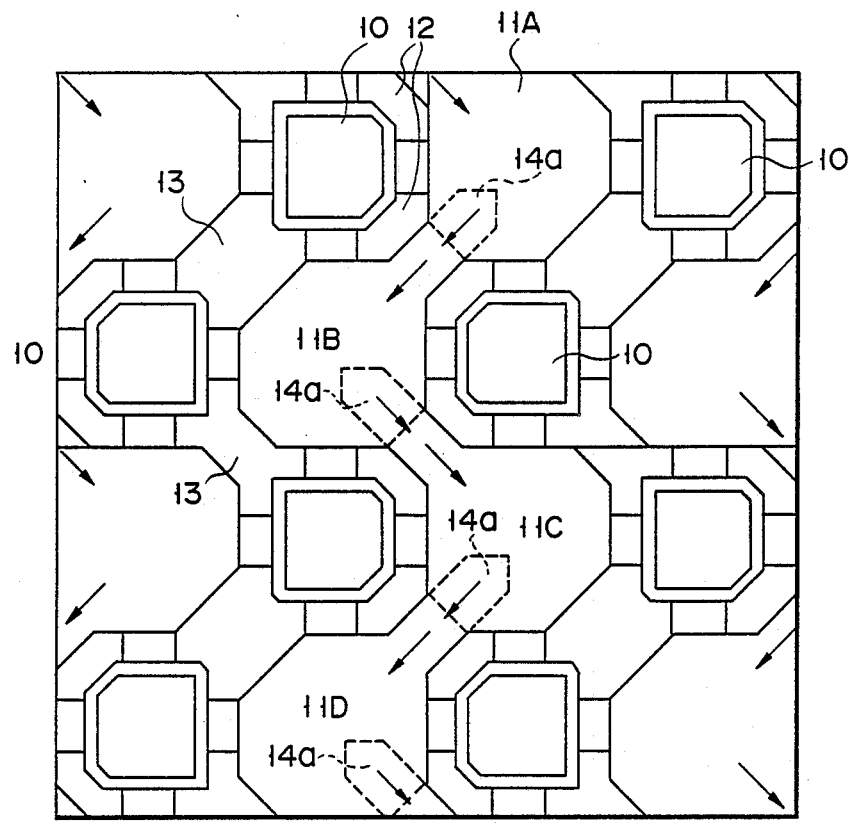
F I G. 9

SOLID IMAGE PICKUP APPARATUS

BACKGROUND OF THE INVENTION

1. Field of the Invention

This invention relates to a solid image pickup apparatus and particularly to a solid image pickup apparatus in which photo sensing elements are coupled with a plurality of vertical transfer electrodes and which is capable of outputting signal charges produced by said photo sensing elements by switching a plurality of said vertical transfer electrodes from one electrode to another as the fields are passed through by turns.

2. Description of the Related Art

For solid image pickup apparatuses, various attempts have been made to reduce false signals due to images which exceed Nyquist limits. One result of these attempts is a solid image pickup apparatus proposed in Japanese Patent Disclosure No. 86-133782. This apparatus is provided with a plurality of charge transfer type solid image pickup elements and a plurality of vertical transfer electrodes which are coupled to photo sensing elements at a rate of four electrodes to one photo sensing element. The apparatus outputs signal charges produced by the photo sensing elements by switching the vertical transfer electrodes from one electrode to another as the fields are passed through by turns.

The operation of this apparatus will be described in the following.

The photo sensing elements are arranged in a checkered pattern. Each photo sensing element is coupled with four vertical transfer electrodes through transfer gate zones. A transfer gate zone is provided for one vertical transfer electrode. In a first field, signal charges produced by four photo sensing elements are read by a first Vertical transfer electrode and output. In the next field, signal charges of the four photo sensing elements coupled to a second vertical transfer electrode are read and output. In the same way, signal charges are read and output by a third and a fourth vertical transfer electrode. Thus, an image is composed of signals from four fields. The feature of this image pickup apparatus is that it is possible to realize an optical aperture greater than a picture element pitch given equivalently and eliminate false signals ascribable to images in excess of Nyquist limits.

As described above, each vertical transfer electrode must read signal charges produced by four photo sensing elements. To this end, it is necessary to provide a channel zone as large as possible. In addition, since the photo sensing elements must be arranged in a checkered pattern, the transfer channel width under a vertical transfer electrode is unavoidably narrow at the area in contact with vertical transfer electrodes of the previous and next stages and wide at the central part along the path of electric charge transfer. Consequently, the electric potential is deeper at the central part of each vertical transfer electrode than in the other area. This gives rise to an electric potential pocket for the electric charges, which results in an improper transfer of the electric charge.

SUMMARY OF THE INVENTION

The object of this invention is to provide a solid image pickup apparatus capable of realizing a good resolution in the vertical direction.

According to the present invention, there is provided a solid image pickup apparatus comprising a substrate;

a plurality of photo sensing elements, arranged on said substrate two-dimensionally and spaced mutually by specified distances, for outputting electric charges on receiving light;

a semiconductor channel formed among said photo sensing elements and transferring electric charges output from said photo sensing elements, said semiconductor channel comprising channel members, each channel member being located inside four photo sensing elements; and a plurality of vertical transfer electrodes, provided on said channel members, for giving electric potential to said channel members and having electric charges transferred to the channel members of the next stages, the improvement in which each of said channel members comprises a wide-width part and a narrow-width part located between the wide-width part and the channel member of the next stage, said narrow-width part having a higher impurity concentration than that of the wide-width part.

BRIEF DESCRIPTION OF THE DRAWINGS

FIGS. 1 through 7 are views to explain a solid image pickup apparatus according to an embodiment of this invention, in which FIG. 1 is a view schematically showing the arrangement of the photo sensors and channels, FIG. 2 is a view, on an enlarged scale, showing a part of FIG. 1 in correct representation, FIG. 3 is a view showing the arrangement of vertical transfer electrodes of the second and fourth groups, FIG. 4 is a view showing the arrangement of vertical transfer electrodes of the first and third groups, FIG. 5 is a view showing the wiring of the vertical transfer electrodes of the first and third groups, FIG. 6 is a flowchart showing the timing of pulses applied to the vertical transfer electrodes, and FIG. 7 is a diagram showing the status of electric potential in the transfer direction in comparison with the prior art; and FIGS. 8 and 9 are views to explain solid image pickup apparatuses according to different embodiments of this invention.

DETAILED DESCRIPTION OF THE PREFERRED EMBODIMENTS

Figure 3:
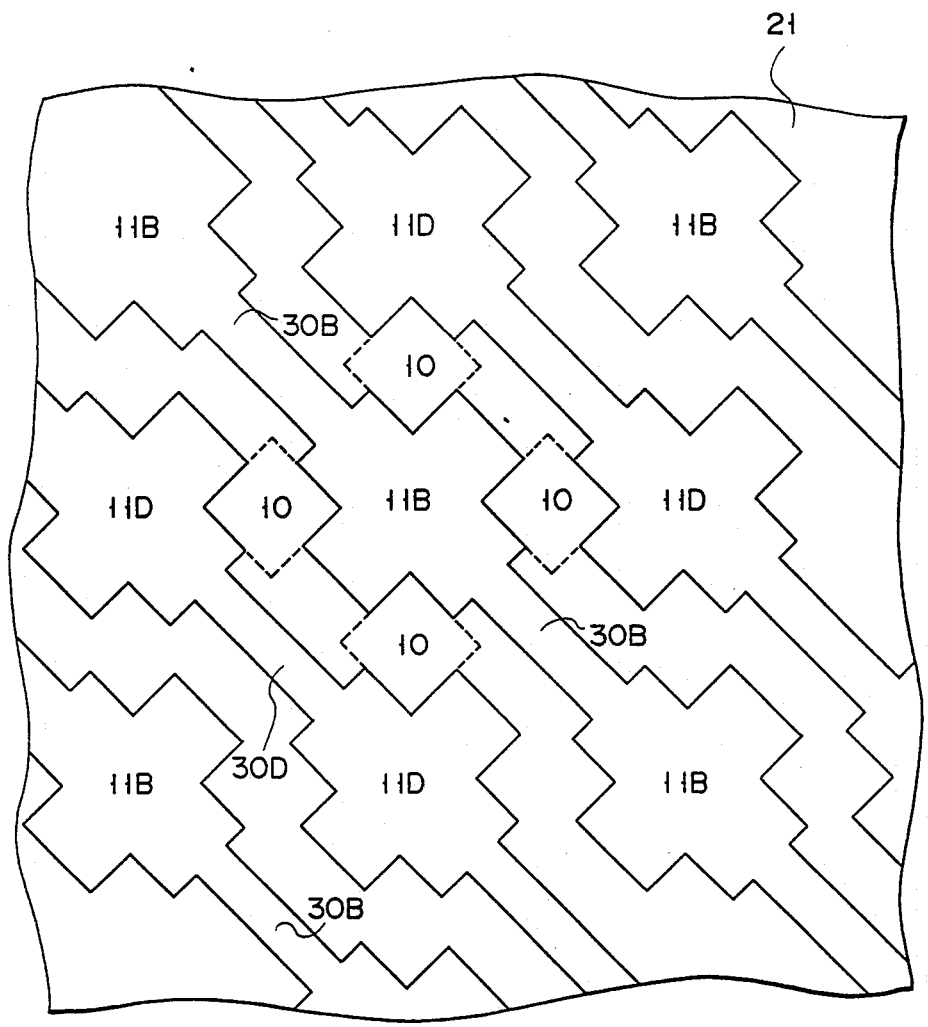

With reference to FIGS. 1 through 7, description will now be made of a solid image pickup apparatus according to one embodiment of this invention.

FIG. 1 is a plan view of the apparatus showing the arrangement of photo sensing elements 10 and vertical transfer electrodes 11A through 11D. In this figure, the overlapped portions of the wires and the electrodes are omitted. Photo sensing elements 10, which are square, are arranged in a regular network as they are mutually spaced apart by specified distances. More specifically, photo sensing elements 10 are arranged such that each of their four side faces is placed against one side face of adjacent photo sensing element 10. Those photo sensing elements are positioned in such a manner that their side faces are diagonal to the scanning direction of the screen, preferably at 45 degrees. The photo sensing elements are each constituted by a wellknown element such as a photo diode or an MOS transistor. Transfer gate zones 12 is formed on each side of photo sensing element 10. There are transfer channels between the transfer gate zones or read-out gate zones of different elements 10. Each transfer gate has part 12a to enable the transfer of electric charge and part 12b to inhibit the transfer of electric charge. Each of those two parts accounts for half the side dimensions of a photo sensing element and covers half of each side. In other words, half of each side of a photo sensing element allows the transfer of electric charge. Above-mentioned transfer electrodes 11A through 11D are provided on the transfer channel with gate insulating coating applied therebetween. In a transfer channel, channel stop zones are formed where necessary in such a way that they extend between two photo sensing elements 10 facing with each other. The construction as described is the same as disclosed in Japanese Patent Disclosure No. 86-133782 and by the same operation, signal charges are output, description of which is not repeated, therefore.

Vertical transfer electrodes 11A through 11D of the first to fourth groups are the electrodes of the first to fourth phases corresponding to the respective specific gravities of the picture elements. The electrodes of each group are connected electrically with one another and this apparatus is thus made in a fourphase electrode structure. A transfer gate zone is covered by the lateral sides of the vertical transfer electrodes. During the vertical transfer of signal charge in which the signal charge is transferred along the zigzag route which has bends of 90 degrees as shown by the arrows of the broken lines in FIG. 1, the potential of the transfer section is the lowest and that of transfer gate zones is higher. Hence, transfer gate areas 12 also serve as the channel stops.

In this invention, the impurity concentration of the transfer channel in the region where the vertical transfer electrodes come into contact with the vertical transfer electrodes of the next stages in the direction of charge transfer is higher than that of the other regions. An embodied example will now be described with reference to FIG. 2.

Figure 4:
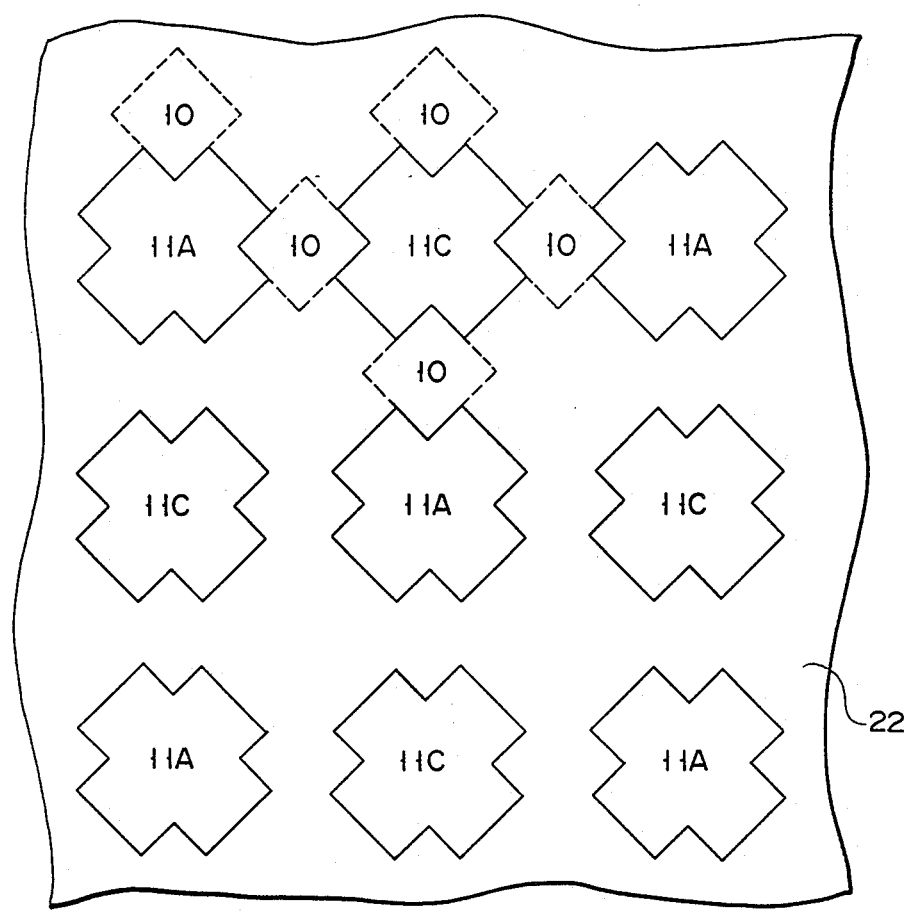
Figure 5:
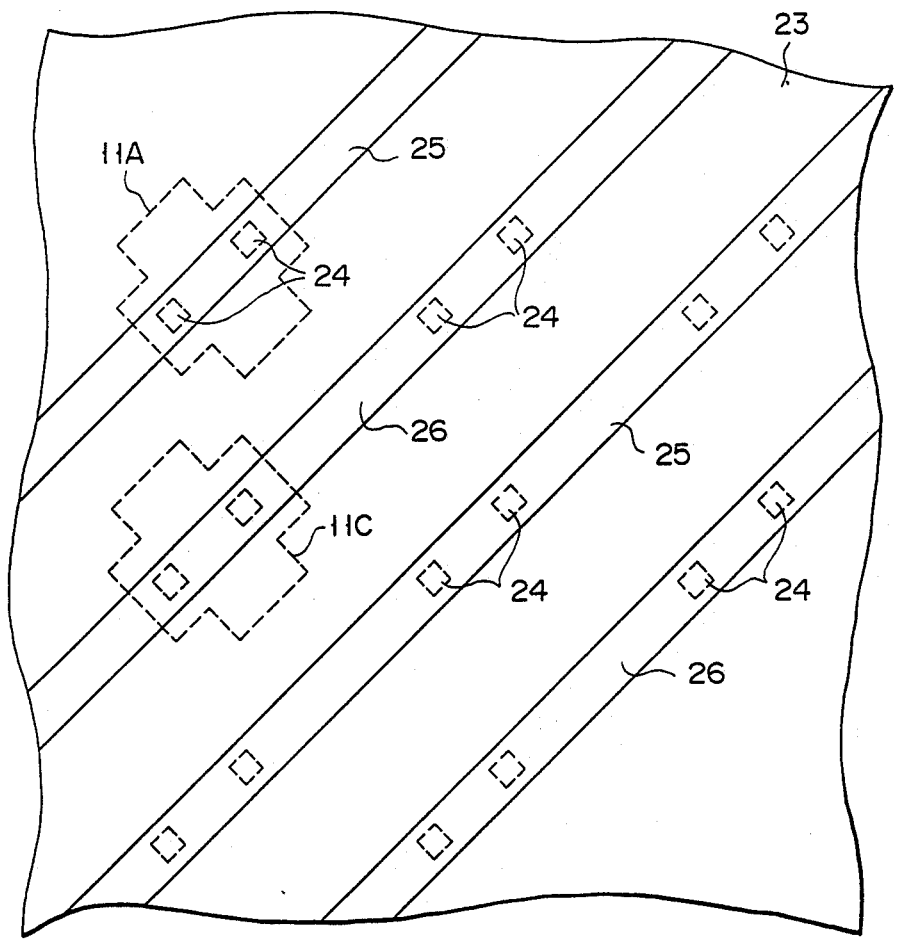

A P-type well or semiconductor body is formed by introducing boron to an impurity concentration of $5 \times 10^{11}$ cm$^{-2}$ into a part of an N-type silicon substrate 20 by using ion implantation or diffusion. By introducing boron into the well by the same process, transfer gate regions 12 and ion stoppers 13 are formed which are the high-impurity regions of the same conductivity type as the well and have a higher impurity concentration than the well. Then, by employing the same technique, phosphorus is introduced into the well to an impurity concentration of $1 \times 10^{12}$ cm$^{-2}$ to thereby form N-type transfer channels 14 in a lattice pattern structure. Many cross-shaped channels 14 are interconnected at the ends of their four arms. The four arms of channel 14 extend from the central or wide part radially forming 90 degrees with the adjacent arms and they have flat and rectangular end faces and side faces. The arm portions are here referred to as the narrow-width portions since they are narrower than the central part. Above-mentioned transfer gate regions 12 are formed such that signal charges from the photo sensing elements can be absorbed by the channel. Channel stops 13 mentioned above of channel 14 are formed in two of the four arm portions, the remaining two arm portions being used as input and output parts. First gate oxide film 22 (shown in FIG. 4), which is made of silicon dioxides, is formed on substrate 20 by using the heat oridizing process. Through this gate oxide film, ions of phosphorus are implanted in the surface of the substrate with an impurity concentration of $1 \times 10^{11} \sim 5 \times 10^{11}$ cm$^{-2}$, for example $3 \times 10^{11}$ cm$^{-2}$. This ion implantation of phosphorus is confined to the output-side arm of the four arms of each cross-shaped channel 14, that is to say, in that zone which is in contact with the vertical transfer electrode of the next stage in the direction of signal charge transfer. In this way, high-concentration zones 14a are formed. As a result, zones 14a are deeper in potential than in zones (central zones) 14b in the centers of vertical transfer electrodes. In this example, the high-concentration zone is formed such that its one end coincides with one end of an arm and the other end is flush with the plane between the outer faces of adjacent transfer gate zones 12. A polycrystalline silicon layer is formed on the gate oxide film 21 and vertical transfer electrodes 11A and 11C are formed by patterning utilizing a photo-printing technique. Electrodes 11A and 11C of the first and third groups are formed so as to be independent as shown in FIG. 4. The electrodes of the first and third groups are provided diagonally to the scanning direction of the screen and at 45 degrees in this example. Next, second gate oxide film 21 (shown in FIG. 3) is formed on the afore mentioned vertical transfer electrodes 11A and 11C. In the same way as described above, a polycrystalline silicon film is formed on this gate oxide film and vertical transfer electrodes 11B and 11D of the second and fourth groups are formed by patterning. This patterning is performed such that the electrodes of the same group are connected by polycrystalline silicon wirings 30B and 30D. In FIGS. 3 and 4, the photo sensing elements are indicated by four representative pieces and the other ones have been omitted. Then, insulating film 23 is formed on the electrodes. After contact holes have been formed where there are vertical transfer electrodes 11A and 11C of the first and third groups, aluminium is vapor-deposited on insulating film 23. By patterning, wiring 25 to connect vertical transfer electrodes 11A of the first group and wiring 26 to connect vertical transfer electrodes 11C are formed as shown in FIG. 5. In FIG. 5, only one each of vertical transfer electrodes 11A and 11C of the first and third groups are indicated and the other ones are omitted. Like the electrodes of the second and fourth groups, the electrodes of the first and third groups are positioned diagonally to the scanning direction of the screen. Consequently, the light-receiving faces of the photo sensing elements are not covered with the wirings, thus increasing the light-receiving efficiency and the degree of integration.

In the above-mentioned example, high-concentration zones 14a are formed at the same time in the channels of the first to fourth groups after the first gate oxide film has been formed. However, it is possible to form high-concentration zones 14a only in the channels of the first and third groups and then form high-concentration zones 14a in the channels of the second and fourth groups after the second oxide film has been formed.

In the apparatus according to the above embodiment, one vertical transfer electrode is connected with four photo sensing elements 10. Therefore, by applying read-out drive voltage Vn (10V for example) to an electrode of one phase of the electrodes of four phases, signals can be taken separately by the four photo sensing elements in contact with the outer periphery of the electrode of that phase. The signals can be added and transferred to the channel under the electrode of that one phase.

For example, if read-out drive voltage Vn is applied to first electrode 11A in the field blanking period of the first field, the charges are transferred as indicated by the arrows of the broken line of FIG. 1. Thereafter, the charges are transferred along the channels corresponding to first electrode 11A, second electrode 11B, third electrode 11C and fourth electrode 11D.

Figure 6:
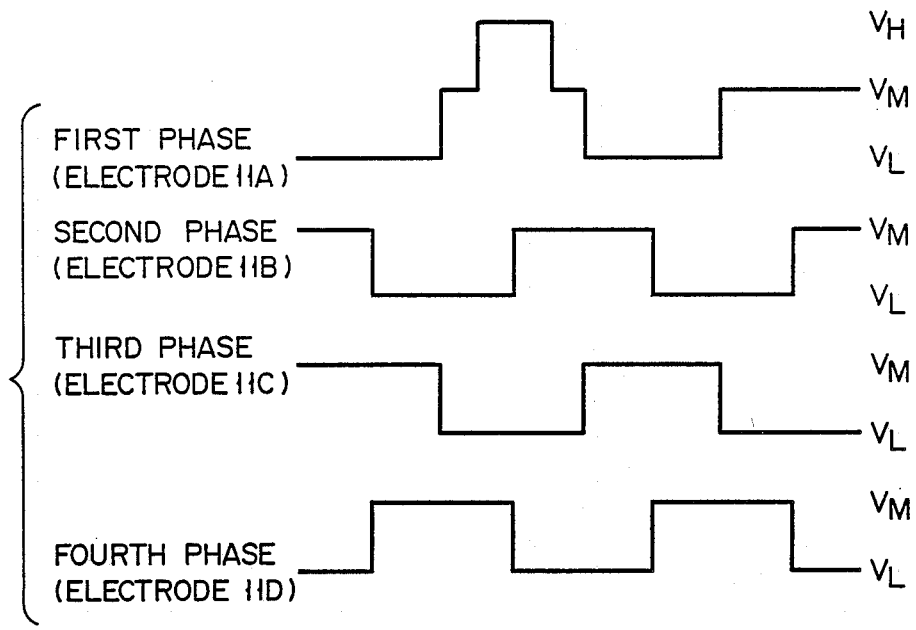

As voltage Vn is applied to one electrode of the electrodes of four phases once for each field, a total signal obtained from four photo sensing elements is sent to the transfer section of (under the vertical transfer electrode) of the channel. Combinations of the four photo sensing elements can be changed for different fields. As described above, a total signal is transferred to under vertical transfer electrode 11 and combinations of four photo sensing elements are varied for the electrode of different phases. FIG. 6 is a timing chart of pulses applied to vertical transfer electrodes 11A through 11D to effect the vertical transfer of charges.

Figure 7:
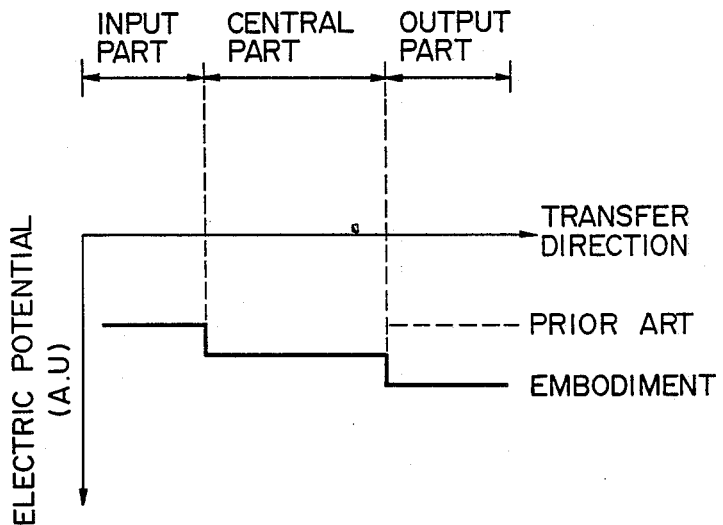

FIG. 7 shows the profile of the electric potential in the direction of signal charge transfer of a cross-shaped channel member under a vertical transfer electrode in comparison with the prior art. In this figure, the absissa indicates the directions of transfer, that is, the input, central and output sections of the channel and the ordinate indicates the electric potential in the channel member. The solid lines show the characteristics in this invention and the broken line shows the characteristics of the prior art. The input and output parts of a cross-shaped channel member are narrower than the central part and therefore, have a shallow potential than the central part so long as the prior art is used. According to this invention, on the other hand, the output part is constituted by high impurity concentration zone 14a, the electric potential of the output part is deeper than that of central part 14b. Therefore, by using an apparatus of this invention, it is possible to securely transfer signal charges and obtain a better resolution in the vertical direction.

In the apparatus according to the above embodiment, four vertical transfer electrodes corresponding to four transfer gate zones are connected through these gates to a photo sensing element. Hence, the signal charge which is produced finely by the photo sensing elements for each field is transferred through one of the four transfer gates to the vertical transfer electrode. In other words, the photo sensing elements are reset for every field to the potential under the transfer gate. The potential under vertical transfer electrodes 11 in contact with the transfer gates that affects the potential of the transfer gates must be identical. In the above embodiment, the high impurity concentration zones made to have a deep potential are not in direct contact with the photo sensing elements.

Figure 8:
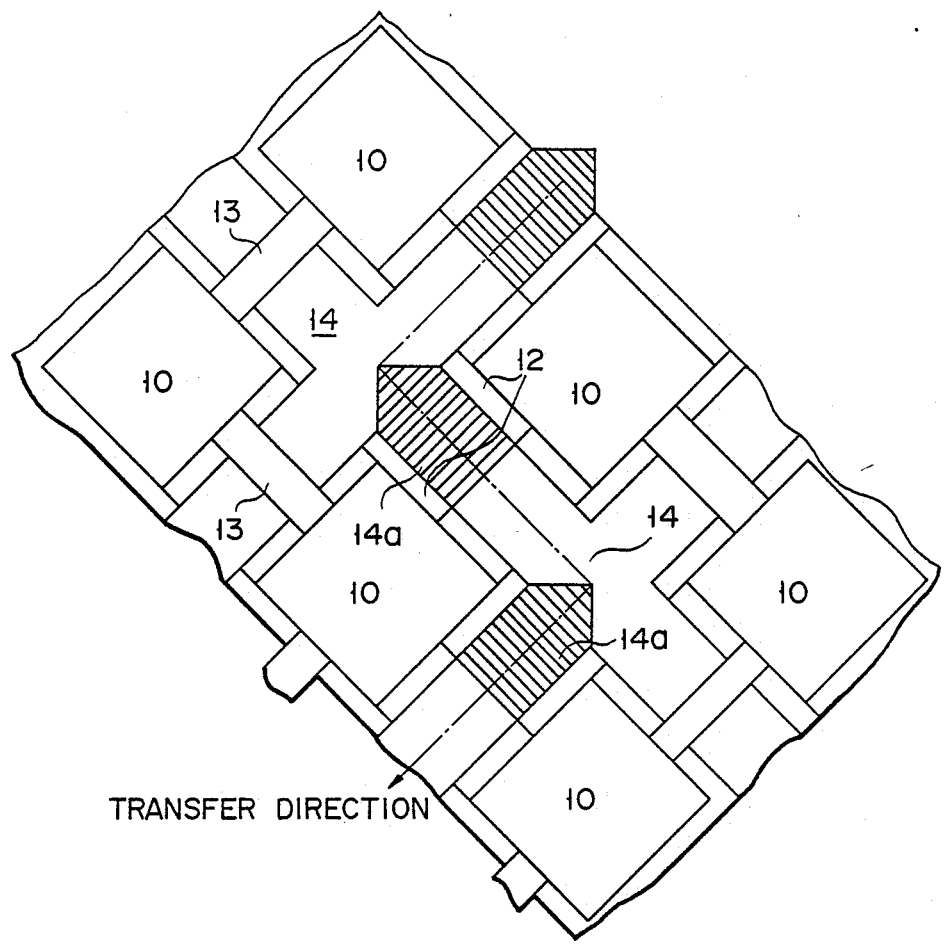

In an embodiment shown in FIG. 8, high impurity concentration zones 14a are made in a different shape from that of the earlier-described embodiment. To be more specific, high impurity concentration zone 14a is formed in an angled shape such that the pointed end is located in the center of the channel. The center of the channel at which the pointed end of high impurity concentration zone 14a is positioned almost agrees with the center of the distances between the corners of the four adjoining photo sensing elements. With the construction as described above, even if the concentration of high impurity concentration zones 14a is reduced from that of the above-mentioned embodiment, equivalent effects may be obtained. The pointed end of high impurity concentration zone 14a may be defined either by straight lines or curved lines of the peripheral edge so long as the pointed end extends in the longitudinal direction of the channel member. The shape of the pointed end should preferably be symmetric with respect to the transfer direction of the signal charge.

In the above embodiment, the photo sensing elements are formed in a square shape and the channel members of channel 14 are formed in a cross shape. This invention, however, is not limited to use of such shapes. A modification will now be described with reference to FIG. 9.

Photo sensing elements 10 are formed in a hexagonal shape by cutting off a little the two adjacent corners of the square. Each channel member comprises a heptagonal main part and a rectangular auxiliary part extending from one corner of the main part. The auxiliary part is located at the input side and connected to the end face of the output side which makes almost a right angle with the extending direction of the auxiliary part of another channel member. High impurity concentration zones 14a extend from the end faces of the output parts of the channel member. Transfer gates 12 and channel stoppers 13 are formed in such a manner that they match the shapes of the photo sensing elements and channel member.

In the above-mentioned embodiment, the output parts of the channel members are given a higher impurity concentration than the other zones in order to obtain a shallow potential at the output part zones of the channel members. However, it is possible to make shallow the potential of the zones other than the output zones by introducing impurities of a conductivity type opposite from the zones other than the output zones. In other words, the net impurity concentration has only to be higher than in the output zones than in the other zones.

What is claimed is:

1. In a solid image pickup apparatus comprising:
   a substrate;
   a plurality of photo sensing semiconductor elements of a first conductivity type, arranged two-dimensionally on said substrate and spaced a specified distance apart from each other, for outputting electric charges on receiving a light;
   a semiconductor channel formed among said photo sensing elements and transferring electric charges output from said photo sensing semiconductor elements, said semiconductor channel comprising channel members arranged in stages, each channel member being of a second conductivity type and being located between four photo sensing elements; and
   a plurality of vertical transfer electrodes, provided on said channel members, for applying an electric potential to said channel members and transferring electric charges to channel members of a next stage, the improvement in which each of said channel members comprises a wide-width part and a narrow-width part located between the wide-width part and the channel member of a next stage, said narrow-width part having a higher impurity concentration than that of the wide-width part.

2. The solid image pickup apparatus according to claim 1, further comprising transfer gates between said photo sensing elements and channel members, each transfer gate having a part to enable the transfer of electric charges and a part to inhibit the transfer of electric charges.

3. The solid image pickup apparatus according to claim 1, wherein the plurality of said vertical transfer electrodes include electrodes of first to fourth groups, first to fourth wirings being provided to electrically and mutually connect the electrodes of the separate groups and extending over the channel members.

4. The solid image pickup apparatus according to claim 3, wherein said wirings extend on said channel, said wirings not substantially being located on said photo sensing elements.

5. The solid image pickup apparatus according to claim 1, wherein said narrow-width part of each channel member has a rectangular ion-implanted region having one end in contact with the channel member of a next stage and an opposite end in contact with the wide-width part.

6. The solid image pickup apparatus according to claim 1, wherein said narrow-width part includes an ion-implanted region having one end in contact with the channel member of a next stage and an opposite end extending into the wide-width part.

7. The solid image pickup apparatus according to claim 6, wherein the opposite end of said narrow-width part has a protruding point located almost at the center of four electrodes adjacent to the channel member of a next stage.

8. The solid image pickup apparatus according to claim 1, wherein each of said channel members has a cross shape having a central part and four arms extending from the central part and forming right angles therebetween, one of said arms constituting said narrow-width part and one of the two arms which are at right angles with the arm is in contact with the narrow-width part of a channel member of a previous stage.

9. The solid image pickup apparatus according to claim 8, wherein the remaining two arms of the four arms of said channel member have a channel stop each to hinder the transfer of electric charges.

10. A solid image pickup apparatus comprising:
a semiconductor body of a first conductivity type having a flat surface;
a plurality of photo sensing elements, arranged two-dimensionally on said flat surface of said semiconductor body and spaced a specified distance apart from each other, for outputting electric charges on receiving a light;
a channel of a second conductivity type formed in said semiconductor body between said photo sensing elements and capable of transferring electric charges output from said photo sensing elements, said channel having a plurality of channel members arranged in stages, each located within a plurality of photo sensing elements and grouped in a plurality of groups, said channel members each having an output part which has a higher impurity concentration than the other parts;
a plurality of vertical transfer electrodes, provided on said channel members, for applying an electric potential to said channel members and transferring electric charges to channel members of a next stage.

11. The solid image pickup apparatus according to claim 10, wherein said channel members each have a protruding part connected to the output part of a channel member of a previous stage and constituting an input part, on either side of said protruding part there is provided one of said photo sensing elements.

12. The solid image pickup apparatus according to claim 11, wherein said output part extends toward the center of each channel member, the input part of each channel member extending at right angles with the extending direction of the output part of each channel member.

* * * * *